(12) United States Patent
Tsuno et al.

(10) Patent No.: US 10,837,113 B2
(45) Date of Patent: Nov. 17, 2020

(54) SHOWER HEAD, PROCESSING APPARATUS, AND SHOWER PLATE

(71) Applicant: Kabushiki Kaisha Toshiba, Minato-ku (JP)

(72) Inventors: Satoshi Tsuno, Taito (JP); Masashi Yamage, Yokohama (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 74 days.

(21) Appl. No.: 15/917,987

(22) Filed: Mar. 12, 2018

(65) Prior Publication Data

US 2019/0085458 A1    Mar. 21, 2019

(30) Foreign Application Priority Data

Sep. 15, 2017    (JP) ................. 2017-178344

(51) Int. Cl.
| | |
|---|---|
| *C23C 16/50* | (2006.01) |
| *C23C 16/52* | (2006.01) |
| *C23C 16/513* | (2006.01) |
| *B05B 13/02* | (2006.01) |
| *B05B 1/18* | (2006.01) |
| *C23C 16/455* | (2006.01) |
| *H01J 37/32* | (2006.01) |
| *C23C 16/509* | (2006.01) |

(52) U.S. Cl.
CPC .............. *C23C 16/52* (2013.01); *B05B 1/185* (2013.01); *B05B 13/02* (2013.01); *C23C 16/45565* (2013.01); *C23C 16/509* (2013.01); *C23C 16/513* (2013.01); *H01J 37/3244* (2013.01); *H01J 37/3266* (2013.01); *H01J 37/32422* (2013.01)

(58) Field of Classification Search
CPC .. C23C 16/52; C23C 16/45565; C23C 16/509; C23C 16/513; H01J 37/3244; H01J 37/3266; H01J 37/32422; B05B 13/02; B05B 1/185
USPC ..... 118/715, 723 MA, 723 MR; 156/345.29, 156/345.46, 345.42
See application file for complete search history.

(56) References Cited

U.S. PATENT DOCUMENTS

| | | | |
|---|---|---|---|
| 6,203,620 B1 * | 3/2001 | Moslehi ................ | H01J 37/321 118/723 R |
| 6,267,074 B1 * | 7/2001 | Okumura ............ | C23C 16/5096 118/723 ER |

(Continued)

FOREIGN PATENT DOCUMENTS

| | | |
|---|---|---|
| JP | H09-263949 | 10/1997 |
| JP | H11-283926 | 10/1999 |

(Continued)

*Primary Examiner* — Rudy Zervigon
(74) *Attorney, Agent, or Firm* — Oblon, McClelland, Maier & Neustadt, L.L.P.

(57) ABSTRACT

According to one embodiment, a shower head includes a head and a magnetic field generator. The head includes a first surface, a second surface opposite to the first surface, an internal compartment, and a plurality of holes. Each of the holes is open to the first surface and to the second surface that faces the compartment, and communicates with the compartment. The magnetic field generator generates a magnetic field inside the holes between the first surface and the second surface.

14 Claims, 11 Drawing Sheets

(56) References Cited

U.S. PATENT DOCUMENTS

| | | | |
|---|---|---|---|
| 6,333,601 B1 * | 12/2001 | Wickramanayaka | ............ H01J 37/32091 118/723 MR |
| 7,972,469 B2 * | 7/2011 | Hanawa | ............ H01J 37/32623 156/345.46 |
| 2005/0028935 A1 | 2/2005 | Wickramanayaka et al. | |
| 2008/0257261 A1 * | 10/2008 | Hanawa | ............ H01J 37/32623 118/719 |
| 2010/0006225 A1 | 1/2010 | Yokogawa et al. | |

FOREIGN PATENT DOCUMENTS

| | | |
|---|---|---|
| JP | 2005-19606 A | 1/2005 |
| JP | 2007-059943 | 3/2007 |
| JP | 4043089 | 11/2007 |
| JP | 2010-21404 A | 1/2010 |
| WO | WO 2012/054200 A2 | 4/2012 |

* cited by examiner

SHOWER HEAD, PROCESSING APPARATUS, AND SHOWER PLATE

CROSS-REFERENCE TO RELATED APPLICATIONS

This application is based upon and claims the benefit of priority from Japanese Patent Application No. 2017-178344, filed on Sep. 15, 2017, the entire contents of which are incorporated herein by reference.

FIELD

Embodiments described herein relate generally to a shower head, a processing apparatus, and a shower plate.

BACKGROUND

Processing apparatuses are known, including a shower head that ejects a fluid from holes toward an object. Such a processing apparatus turns the fluid ejected from the shower head into a plasma to thereby form a film on the surface of the object, for example.

Processing efficiency of the processing apparatus that includes the shower head can be improved by adjusting a density of particles contained in the fluid ejected from the holes.

DETAILED DESCRIPTION

In general, according to one embodiment, a shower head includes a head and a magnetic field generator. The head includes a first surface, a second surface opposite to the first surface, and an internal compartment, the head provided with a plurality of holes that is open to the first surface and to the second surface facing the compartment, the holes communicating with the compartment. The magnetic field generator generates a magnetic field inside the holes between the first surface and the second surface.

First Embodiment

The following describes a first embodiment with reference to FIGS. 1 to 6. In this specification, vertically upward is defined as upward and vertically downward is defined as downward. Elements in the embodiments below and descriptions thereof may be expressed differently, which does not exclude any other expression not used herein to express these elements and descriptions thereof. Furthermore, elements and descriptions thereof may be expressed herein with no alternative explicitly mentioned, which does not exclude any other expression not used herein to express these elements and descriptions thereof.

Figure 1:
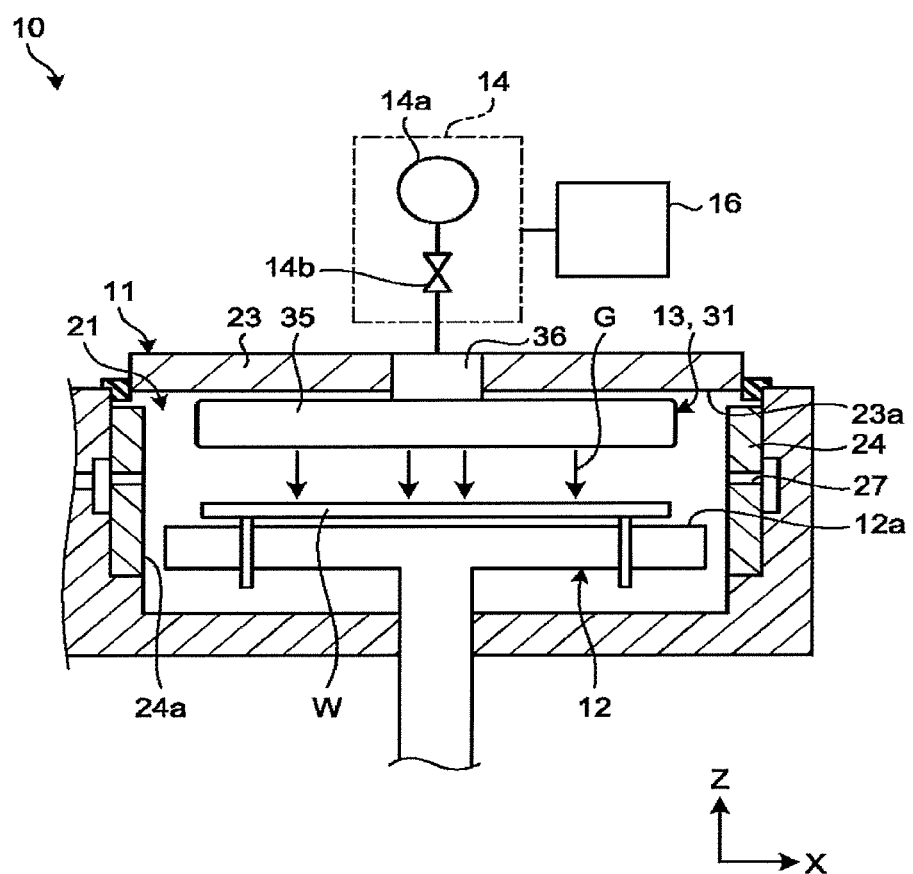
FIG. 1 is a schematic cross-sectional view of a semiconductor manufacturing apparatus according to a first embodiment.

FIG. 1 is a schematic cross-sectional view of a semiconductor manufacturing apparatus 10 according to a first embodiment. The semiconductor manufacturing apparatus 10 represents an exemplary processing apparatus and may be also referred to as, for example, a manufacturing apparatus, a machining apparatus, an ejection apparatus, a supply apparatus, a plasma processing apparatus, and an apparatus. The processing apparatus is not limited to the semiconductor manufacturing apparatus 10 and may be an apparatus that machines, cleans, and tests, for example.

This specification defines an X-axis, a Y-axis, and a Z-axis as illustrated in each of the drawings. The X-axis, the Y-axis, and the Z-axis are orthogonal to each other. The X-axis extends along the width of the semiconductor manufacturing apparatus 10. The Y-axis extends along the depth (length) of the semiconductor manufacturing apparatus 10. The Z-axis extends along the height of the semiconductor manufacturing apparatus 10. In the first embodiment, the Z-axis extends in a vertical direction. The Z-axis may extend in a different direction from the vertical direction.

The semiconductor manufacturing apparatus 10 in the first embodiment illustrated in FIG. 1 is, for example, a plasma chemical vapor deposition (CVD) apparatus. The semiconductor manufacturing apparatus 10 may be any other apparatus. The semiconductor manufacturing apparatus 10 includes a manufacturing unit 11, a stage 12, a shower head 13, a gas supply unit 14, and a control unit 16.

The manufacturing unit 11 may also be referred to as, for example, a housing. The stage 12 is an exemplary placement part and may be also referred to as, for example, a platform and a base. The shower head 13 may also be referred to as, for example, a channel structure, an ejector, a supplier, a jet, a distributor, a discharger, a member, and a part.

The manufacturing unit 11 includes a chamber 21 inside. The chamber 21 can be airtightly sealed. The chamber 21 may also be referred to as, for example, a room or a space. The semiconductor manufacturing apparatus 10 processes a semiconductor wafer (hereinafter referred to as a wafer) W in the chamber 21, for example. The wafer W is an exemplary object. The manufacturing unit 11 has a top wall 23 and lateral walls 24.

The top wall 23 has an inner surface 23a. The inner surface 23a is a substantially flat surface facing downward. The lateral walls 24 have inner lateral surfaces 24a. The inner lateral surfaces 24a face substantially horizontally. The inner surface 23a and the inner lateral surfaces 24a define part of the chamber 21. Specifically, the inner surface 23a and the inner lateral surfaces 24a face the inside of the chamber 21. The lateral walls 24 are provided with a plurality of exhaust ports 27. Drawing a gas from the chamber 21 through the exhaust ports 27 creates a substantial vacuum in the chamber 21.

The stage 12 and the shower head 13 are disposed in the chamber 21. As illustrated in FIG. 1, the stage 12 and the shower head 13 may be partially disposed outside the chamber 21.

The stage 12 includes a support 12a. The support 12a is disposed in the chamber 21 and faces the inner surface 23a of the top wall 23 to support the wafer W. That is, the wafer W is placed on the stage 12. The stage 12 includes a heater and can heat the wafer W supported by the support 12a.

The stage 12 can fix the wafer W to the support 12a by suction, for example. Additionally, the stage 12 is connected to a drive unit such as a motor and is rotatable while supporting the wafer W.

The shower head 13 is attached removably onto the top wall 23 of the manufacturing unit 11, for example. The shower head 13 faces, at a spacing, the wafer W supported by the support 12a of the stage 12.

The shower head 13 can eject a gas G to the wafer W as indicated by arrows in FIG. 1. The gas G is an exemplary fluid. The fluid is not limited to a gas, but may be a liquid or any other type of fluid. The gas G forms an oxide film or a nitride film on the wafer W, for example. The gas G is not limited to this example.

Figure 2:
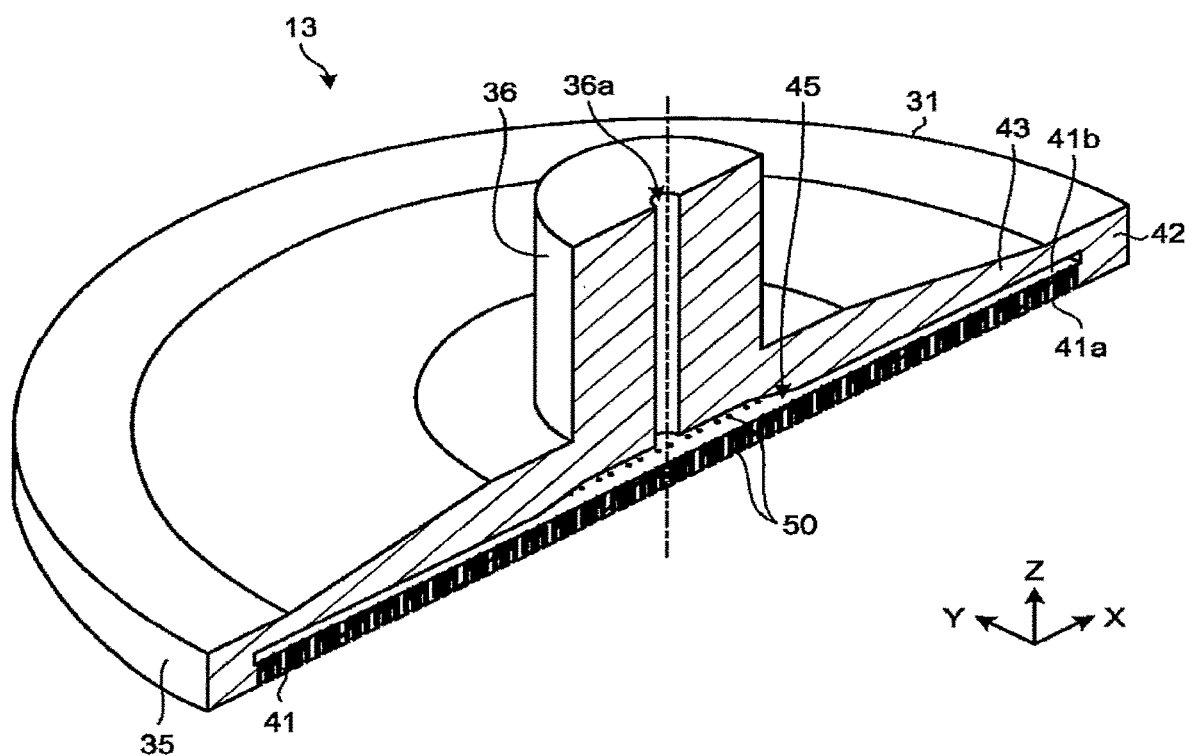
FIG. 2 is a perspective view of part of a shower head in the first embodiment.
Figure 3:
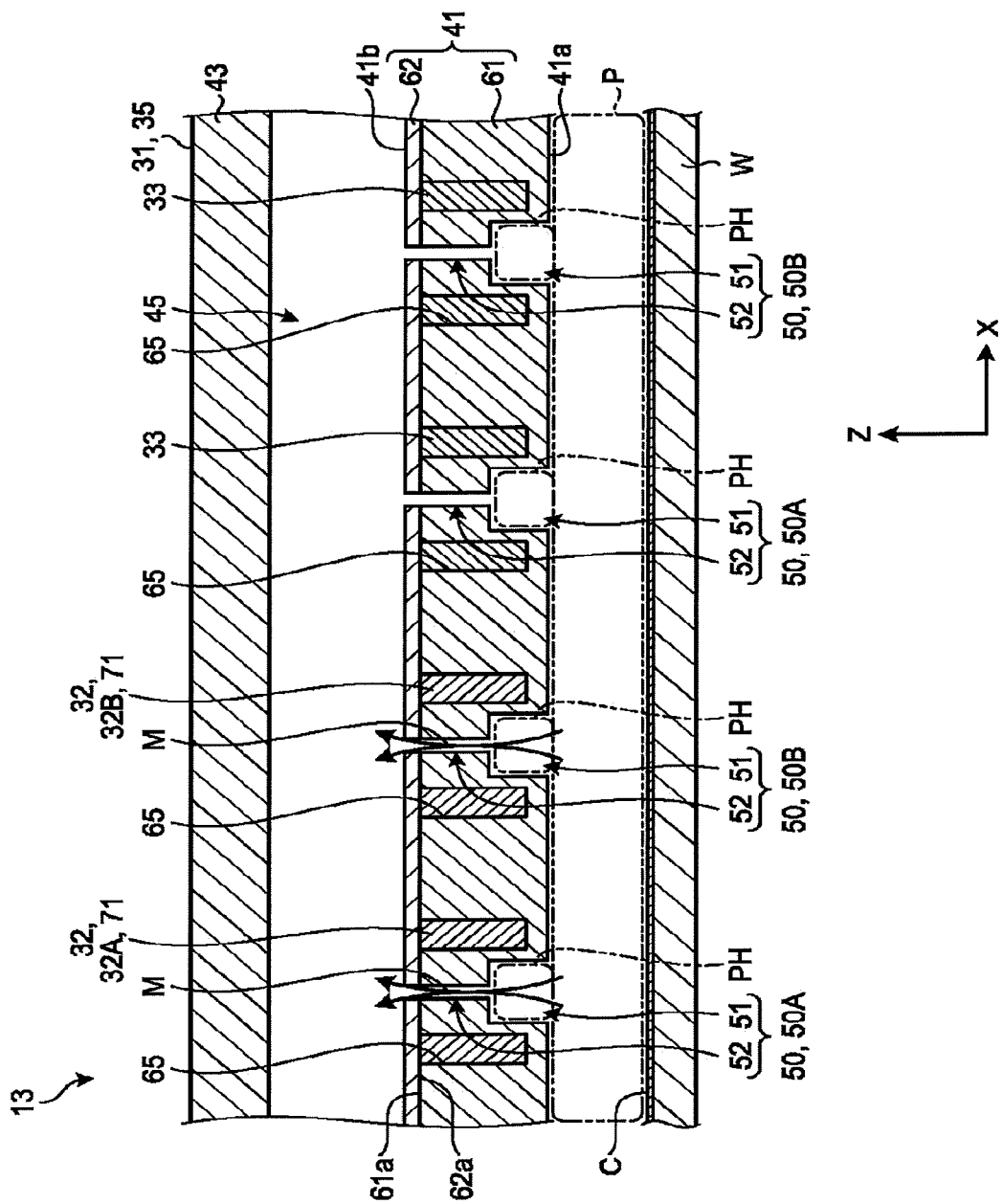
FIG. 3 is a cross-sectional view of part of the shower head in the first embodiment.

FIG. 2 is a perspective view of part of the shower head 13 in the first embodiment. FIG. 3 is a cross-sectional view of part of the shower head 13 in the first embodiment. As illustrated in FIG. 3, the shower head 13 includes a body 31, a plurality of magnetic field generators 32, and a plurality of nonmagnetic parts 33. The body 31 is an exemplary head.

The body 31 is, for example, formed of a nonmagnetic and electrically conductive material that is resistant to the gas G and a plasma P. The material of the body 31 is not limited thereto. As illustrated in FIG. 2, the body 31 includes a diffuser 35 and a pipe 36.

The diffuser 35 has a substantially disc shape extending over an X-Y plane. The pipe 36 has a substantially cylindrical shape extending from a center of the diffuser 35 in a positive Z-axis direction (indicated by the Z-axis arrow; upward).

As illustrated in FIG. 1, the pipe 36 penetrates the top wall 23. By fixing the pipe 36 in the top wall 23, for example, the shower head 13 is attached to the top wall 23 of the manufacturing unit 11. The shower head 13 may nonetheless be attached to the manufacturing unit 11 by any other method.

Referring to FIG. 2, the diffuser 35 includes a bottom wall 41, a peripheral wall 42, and a top wall 43. The bottom wall 41 is an exemplary wall and shower plate. The diffuser 35 includes a diffusion chamber 45 inside. The diffusion chamber 45 is an exemplary compartment. The diffusion chamber 45 may also be referred to as, for example, a space, a path, and a flow channel. The diffusion chamber 45 is surrounded by the bottom wall 41, the peripheral wall 42, and the top wall 43.

The bottom wall 41 has a substantially disc shape extending over the X-Y plane. The bottom wall 41 has an outer surface 41a and an inner surface 41b. The outer surface 41a is an exemplary first surface. The inner surface 41b is an exemplary second surface.

Referring to FIG. 3, the outer surface 41a is a substantially flat surface facing in a negative Z-axis direction (opposite to the direction indicated by the Z-axis arrow; downward). The outer surface 41a is located at an end of the shower head 13 in the negative Z-axis direction. The outer surface 41a faces the outside of the shower head 13. That is, the outer surface 41a forms part of an external surface of the shower head 13. The outer surface 41a may be curved or irregular. The outer surface 41a faces the wafer W supported by the support 12a of the stage 12 with a gap. In other words, the stage 12 supports the wafer W, facing the outer surface 41a.

The inner surface 41b is opposite to the outer surface 41a. The inner surface 41b is a substantially flat surface facing in the positive Z-axis direction. The inner surface 41b may be curved or irregular. The inner surface 41b faces the diffusion chamber 45 and defines part of the diffusion chamber 45.

Referring to FIG. 2, the peripheral wall 42 is a substantially cylindrical wall extending from an edge of the bottom wall 41 in the positive Z-axis direction. The top wall 43 has a substantially disc shape extending over the X-Y plane. The edge of the top wall 43 is connected to the edge of the bottom wall 41 through the peripheral wall 42.

The pipe 36 includes a supply path 36a inside. The supply path 36a extends in Z-axis direction and communicates with the diffusion chamber 45. The supply path 36a communicates with the gas supply unit 14 illustrated in FIG. 1 via, for example, piping. Specifically, the gas supply unit 14 is connected to the diffusion chamber 45 via the piping and the supply path 36a.

As illustrated in FIG. 3, the bottom wall 41 is provided with a plurality of holes 50. The holes 50 may also be referred to as, for example, openings, through holes, and outlets. The holes 50 are each open to the outer surface 41a and the inner surface 41b. The holes 50 communicate with the diffusion chamber 45 and the outside of the shower head 13.

In the first embodiment, the holes 50 have substantially the same shape. The holes 50 may include holes 50 of mutually different shapes or mutually different sizes.

Figure 4:
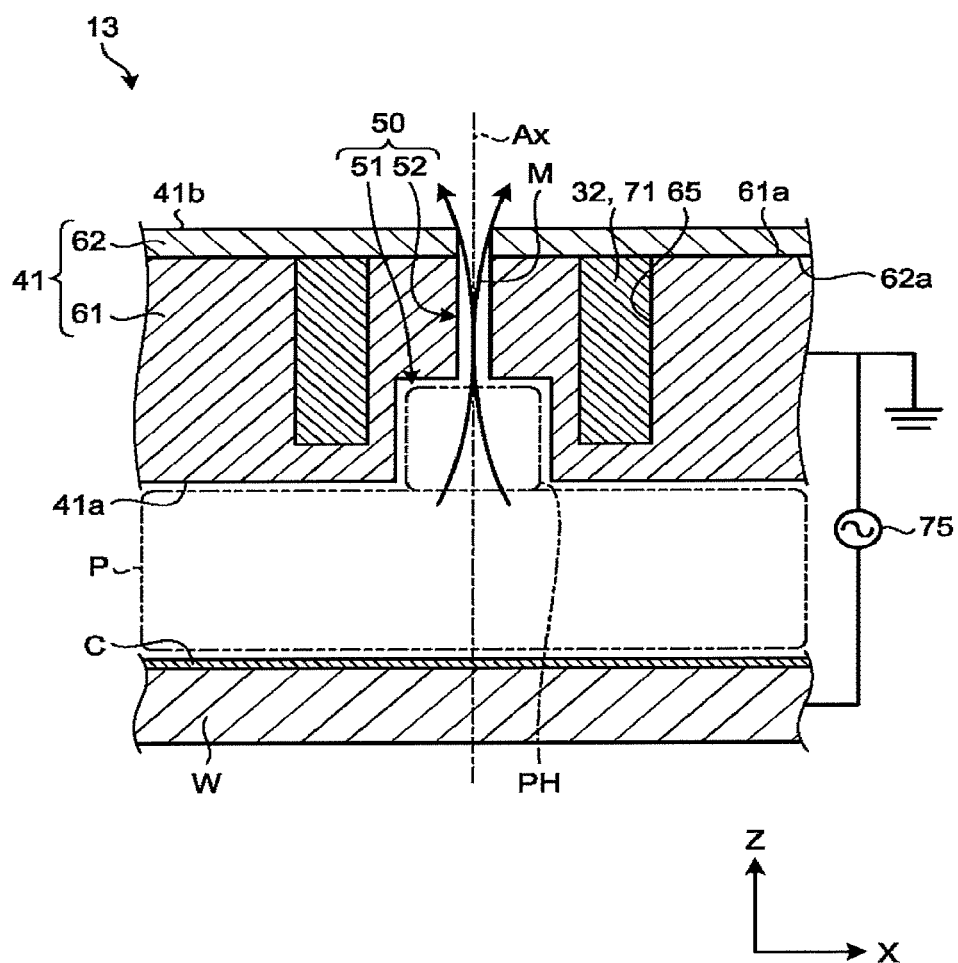
FIG. 4 is a cross-sectional view of part of a bottom wall in the first embodiment.

FIG. 4 is a cross-sectional view of part of the bottom wall 41 in the first embodiment. As illustrated in FIG. 4, the holes 50 each include a first path 51 and a second path 52. The first path 51 may also be referred to as, for example, an enlarged part, a larger diameter part, an electric discharge part, and a cavity. The second path 52 may also be referred to as, for example, a reduced part, a smaller diameter part, and an ejection path.

The first path 51 is open to the outer surface 41a of the bottom wall 41 and has a substantially circular cross section. The second path 52 is open to the inner surface 41b of the bottom wall 41 and has a substantially circular cross section. The first path 51 and the second path 52 extend substantially linearly in the Z-axis direction. Thus, the holes 50 each extend in the Z-axis direction. The second path 52 is smaller in inner diameter than the first path 51. That is, the second path 52 is narrower than the first path 51.

The second path 52 communicates with the first path 51. Specifically, each hole 50 extends from the inner surface 41b to the outer surface 41a in the negative Z-axis direction while being enlarged at a connection between the first path 51 and the second path 52.

The first path 51 and the second path 52 are disposed along the same central axis Ax. In other words, the first path 51 and the second path 52 are coaxial. The holes 50 have their respective central axes Ax.

The bottom wall 41 includes a first wall 61 and a second wall 62. The first wall 61 and the second wall 62 have a substantially disc shape extending over the X-Y plane. In the Z-axis direction, the first wall 61 is longer in length (thickness) than the second wall 62.

The first wall 61 includes the outer surface 41a of the bottom wall 41. That is, the first wall 61 forms the outer surface 41a of the bottom wall 41. The first wall 61 has a first bonding surface 61a. The first bonding surface 61a is opposite to the outer surface 41a and faces in the positive Z-axis direction.

The first wall 61 is provided with the first paths 51 and part of the second paths 52 of the holes 50. The first wall 61 is further provided with a plurality of recesses 65. The recesses 65 are an exemplary space and may also be referred to as, for example, concaves, holes, and housings. The recesses 65 are open to the first bonding surface 61a of the first wall 61.

In the first embodiment, the recesses 65 have a substantially annular cross section and extend along the central axis Ax. Specifically, the recesses 65 extend around the central axes Ax with a spacing. The recesses 65 surround the holes 50 with a spacing. The recesses 65 and the holes 50 surrounded by the recesses 65 have the common central axis Ax and are disposed concentrically. The recesses 65 may have any other shape.

The first path 51 and the second path 52 of each hole 50 are partially surrounded by each recess 65. That is, the first path 51 and the second path 52 are partially located inside the recess 65. The negative Z-axial end of the recess 65 is spaced apart from the positive Z-axial end of the first path 51 in the negative Z-axis direction.

The second wall 62 includes the inner surface 41b of the bottom wall 41. That is, the second wall 62 forms the inner surface 41b of the bottom wall 41. The second wall 62 has a second bonding surface 62a. The second bonding surface 62a is opposite to the inner surface 41b and faces in the negative Z-axis direction.

The second wall 62 is attached to the first wall 61 by bonding the second bonding surface 62a with the first bonding surface 61a. Thereby, the second wall 62 closes the recesses 65. As such, the recesses 65 closed by the second wall 62 are located inside the body 31.

The second wall 62 is provided with part of the second paths 52 of the holes 50. While the second wall 62 is attached to the first wall 61, part of the second paths 52 of the first wall 61 communicates with part of the second paths 52 of the second wall 62.

The magnetic field generators 32 include a plurality of magnets 71. The magnets 71 are, for example, permanent magnets. In the first embodiment, the magnets 71 have a substantially cylindrical shape with a substantially annular cross section and extending along the central axes Ax of the holes 50. The magnets 71 may have any other shape.

The south pole of the magnets 71 is at the positive Z-axial end, and the north pole of the magnets 71 is at the negative Z-axial end. Specifically, the magnetization direction of the magnets 71 is along the Z-axis, in which the holes 50 extend. The north pole of the magnets 71 may be at the positive Z-axial end while the south pole may be at the negative Z-axial end.

Figure 5:
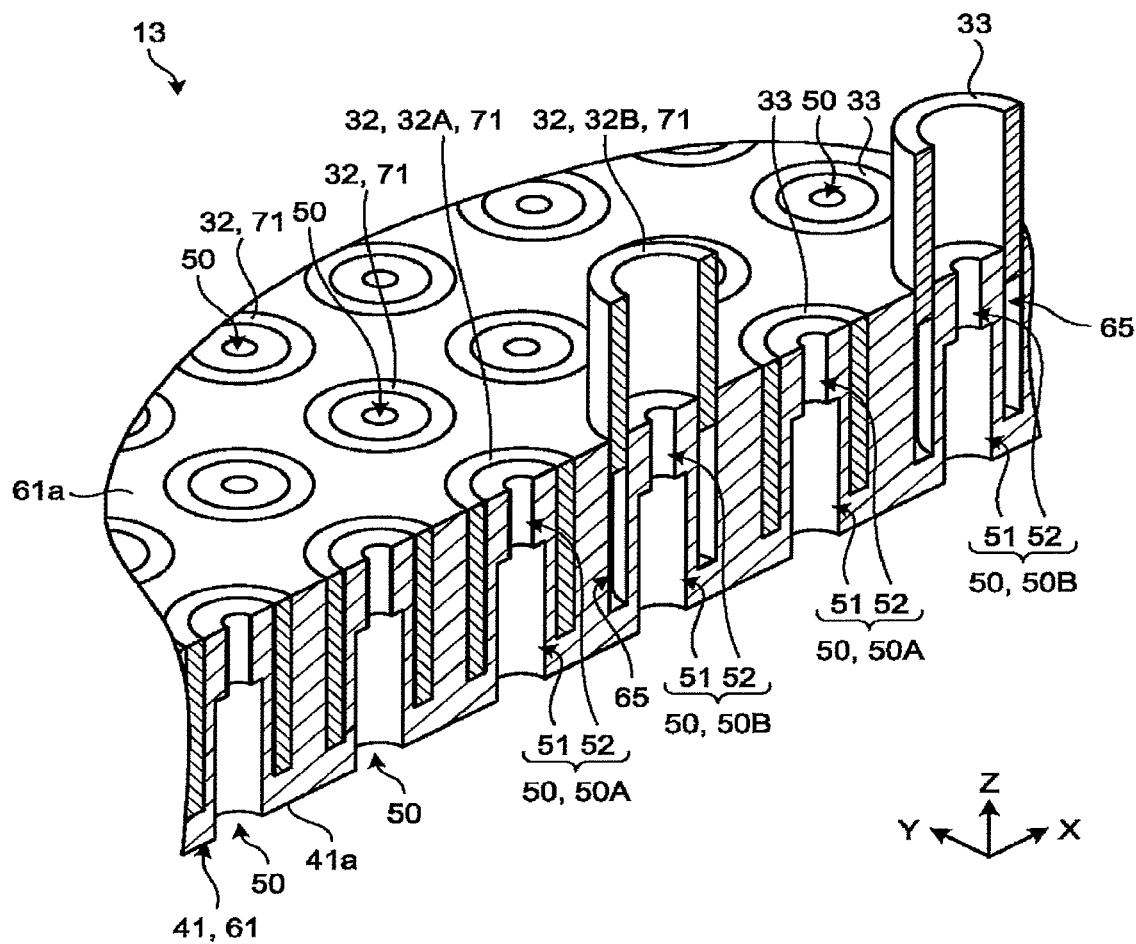
FIG. 5 is a perspective view of part of a first wall and a plurality of magnets in the first embodiment.

FIG. 5 is a perspective view of part of the first wall 61 and the magnets 71 in the first embodiment. As illustrated in FIG. 5, the magnets 71 are housed in the recesses 65. Thus, the bottom wall 41 includes the magnets 71 of the magnetic field generators 32. In the first embodiment, the recesses 65 are greater in number than the magnets 71. Thus, the magnets 71 are housed in some of the recesses 65. The magnets 71 may be housed in all of the recesses 65 or in one of the recesses 65.

The magnets 71 in the recesses 65 each surround one hole 50 with a spacing. The magnets 71 and the holes 50 surrounded by the magnets 71 have the common central axis Ax and are disposed concentrically. Each magnet 71 surrounds part of the first path 51 and part of the second path 52 of the hole 50. That is, the first path 51 and the second path 52 are partially located inside the magnet 71. The negative Z-axial end of the magnet 71 is spaced apart from the positive Z-axial end of the first path 51 in the negative Z-axis direction.

As illustrated in FIG. 4, the magnet 71 generates a magnetic field M inside the hole 50. In FIG. 4, the arrows indicate exemplary magnetic field lines of the magnetic field M. The magnetic field M generated by the magnet 71 includes magnetic field lines that extend along the central axis Ax of the hole 50 surrounded by the magnet 71 between the outer surface 41a and the inner surface 41b of the bottom wall 41. The magnetic field M also includes magnetic field lines outside the magnet 71.

As illustrated in FIG. 5, the nonmagnetic parts 33 have, as with the magnets 71, a substantially cylindrical shape with a substantially annular cross section and extending along the central axis Ax. As with the body 31, the nonmagnetic parts 33 are formed, for example, of a nonmagnetic and electrically conductive material that is resistant to the gas G and the plasma P. The nonmagnetic parts 33 may nonetheless be formed of any other material.

The nonmagnetic parts 33 are housed in the recesses 65. In the first embodiment, the recesses 65 are greater in number than the nonmagnetic parts 33. Thus, the nonmagnetic parts 33 are housed in some of the recesses 65. The nonmagnetic parts 33 may be housed in one of the recesses 65 or none of the nonmagnetic parts 33 may be housed in any of the recesses 65. Hence, the recesses 65 can accommodate the nonmagnetic parts 33 or the magnets 71 as the magnetic field generators 32.

Referring to FIG. 3, the holes 50 include a plurality of first holes 50A and a plurality of second holes 50B. The first holes 50A are, for example, some holes 50 about the center of the bottom wall 41. The second holes 50B are, for example, some holes 50 remoter from the center of the bottom wall 41 than the first holes 50A.

The first holes 50A and the second holes 50B have the same shape and size. Thus, the first holes 50A and the second holes 50B each include the first path 51 and the second path 52. The first holes 50A may differ in shape and size from the second holes 50B.

The magnetic field generators 32 include a plurality of first magnetic field generators 32A and a plurality of second magnetic field generators 32B. The first magnetic field generators 32A are, for example, some magnetic field generators 32 about the center of the bottom wall 41. The second magnetic field generators 32B are some magnetic field generators 32 remoter from the center of the bottom wall 41 than the first magnetic field generators 32A.

The first magnetic field generators 32A and the second magnetic field generators 32B each include the magnets 71. The magnets 71 of the first magnetic field generators 32A surround the first holes 50A. The magnets 71 of the second magnetic field generators 32B surround the second holes 50B.

The first magnetic field generators 32A generate the magnetic fields M inside the first holes 50A between the outer surface 41a and the inner surface 41b of the bottom wall 41. The second magnetic field generators 32B generate the magnetic fields M inside the second holes 50B between the outer surface 41a and the inner surface 41b of the bottom wall 41.

The magnetic fields M generated by the first magnetic field generators 32A are lower in magnetic flux density than the magnetic fields M generated by the second magnetic field generators 32B. Specifically, the first magnetic field generators 32A generate the magnetic fields M inside the first holes 50A at a magnetic flux density different from a magnetic flux density of the magnetic fields M generated inside the second holes 50B by the second magnetic field generators 32B. The magnetic flux density of the magnetic field M generated by the first magnetic field generators 32A and the magnetic flux density of the magnetic field M generated by the second magnetic field generators 32B are not limited to this example.

As illustrated in FIG. 4, the semiconductor manufacturing apparatus 10 further includes an alternating current power source 75. The alternating current power source 75 is an exemplary power source. The alternating current power source 75 applies high frequency voltage to the bottom wall 41 of the shower head 13 and the wafer W supported by the stage 12. The alternating current power source 75 generates a potential difference between the bottom wall 41 and the wafer W.

The gas supply unit 14 illustrated in FIG. 1 is connected to the supply path 36a of the shower head 13 to supply the diffusion chamber 45 with the gas G through the supply path 36a. The gas supply unit 14 includes a tank 14a and a valve 14b. The valve 14b is an exemplary adjuster. The adjuster may be a pump or any other device.

The tank 14a contains the gas G and is connected to the supply path 36a via the valve 14b and piping. With the valve 14b opened, the gas supply unit 14 supplies the gas G from the tank 14a to the supply path 36a. With the valve 14b closed, the gas supply unit 14 stops supplying the gas G. By adjusting an open amount of the valve 14b, a flow rate of the gas G is adjusted. As such, the valve 14b can adjust a state of the gas G to be supplied.

The control unit 16 includes, for example, a processor such as a CPU and a storage such as a ROM and a RAM. The control unit 16 controls the stage 12, the gas supply unit 14, and the alternating current power source 75, for instance.

The semiconductor manufacturing apparatus 10 forms a film C, as illustrated in FIG. 4, on the wafer W in the chamber 21 as will be described below. The film C is exemplarily an oxide film or a nitride film. The control unit 16 controls the gas supply unit 14 to open the valve 14b and supply the gas G to the shower head 13. The gas G is supplied to the diffusion chamber 45 through the supply path 36a. The gas G diffuses in directions along, for example, the X-Y plane in the diffusion chamber 45. The gas G is ejected toward the wafer W on the stage 12 from the holes 50 that communicate with the diffusion chamber 45.

The control unit 16 controls the alternating current power source 75 to generate a potential difference between the bottom wall 41 and the wafer W, as illustrated in FIG. 4. Thereby, the gas G turns into a plasma between the bottom wall 41 of the shower head 13 and the wafer W, generating the plasma P. The gas G and the plasma P cause the film C to grow on the wafer W. As described above, the film C grows on the wafer W by the plasma CVD that generates the plasma P, and the wafer W on which the film C is deposited is manufactured.

Figure 6:
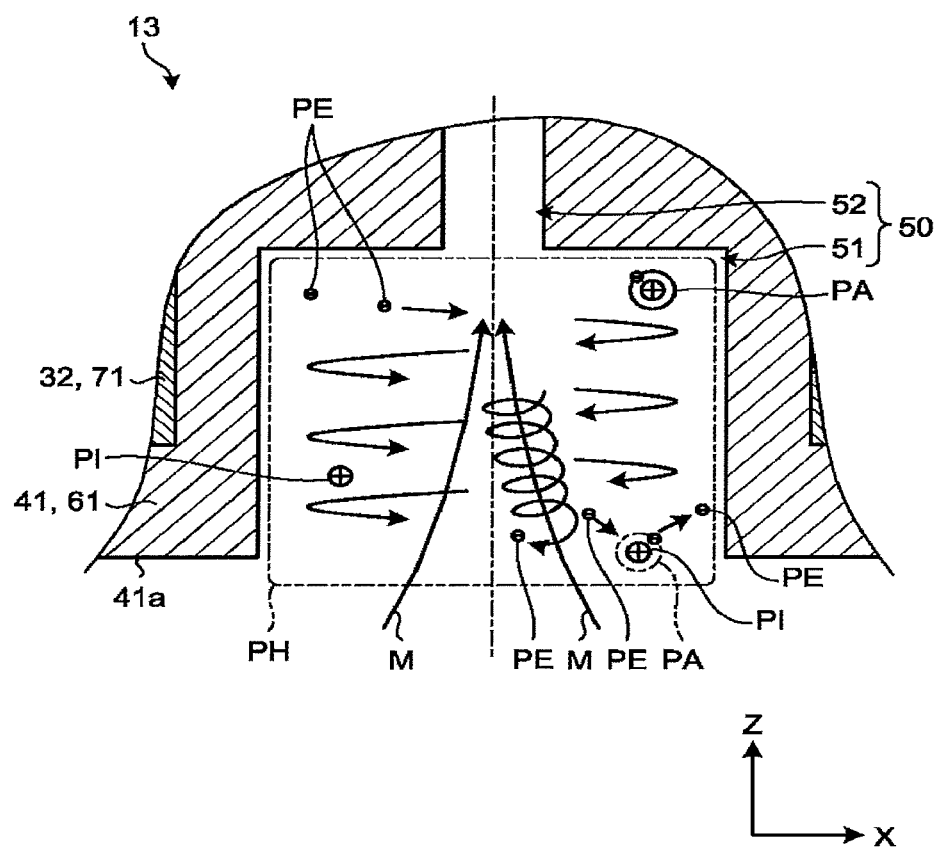
FIG. 6 is a cross-sectional view of part of the bottom wall around one hole in the first embodiment.

FIG. 6 is a cross-sectional view of part of the bottom wall 41 around one of the holes 50 in the first embodiment. As illustrated in FIG. 6, a high-density plasma PH occurs inside the first path 51 of the hole 50. The high-density plasma PH is of the plasma P and has a density higher than a density of the plasma P between the bottom wall 41 and the wafer W. The high-density plasma PH occurs as follows, for example.

As described above, the magnets 71 generate the magnetic fields M inside the holes 50. In general, charged particles circle around the magnetic field lines by the Lorentz force in the magnetic field M. For example, charged particles, electrons PE and ions (radicals) PI of the gas G and the plasma P, circle around the magnetic field lines in the magnetic field M. The electrons PE, which are lighter in weight than the ions PI, are susceptible to the Lorentz force.

The magnetic field M occurs and the magnetic field lines of the magnetic field M gather inside the first path 51 of each hole 50. As a result, the electrons PE circle around the magnetic field lines of the magnetic field M, thereby enhancing the density of the electrons PE inside the first path 51. In other words, the electrons PE are trapped or caught by the magnetic field lines of the magnetic field M inside the first path 51. The electrons PE are thus likely to collide with atoms PA inside the first path 51. That is, ionization of the atoms PA and plasmatization of the gas G are accelerated, increasing the density of the plasma P in the first path 51. Thus, the high-density plasma PH is generated in the first path 51.

Furthermore, the alternating current power source 75 applies voltage to the bottom wall 41 having the first path 51 wider than the second path 52, causing a hollow cathode discharge inside the first path 51. By the hollow cathode discharge, the electrons PE reciprocate motion about the central axis Ax inside the first path 51. This enhances the density of the electrons PE inside the first path 51, facilitating the collision between the electrons PE and the atoms PA. That is, ionization of the atoms PA and plasmatization of the gas G are accelerated, enhancing the density of the plasma P in the first path 51. Thus, the high-density plasma PH is generated in the first path 51.

As described above, by the magnetic field M and the hollow cathode discharge, the plasma density is enhanced to the high-density plasma PH in the first path 51. The high-density plasma PH generated in the first paths 51 surrounded by the magnets 71 is higher in density than the high-density plasma PH generated in the first paths 51 surrounded by the nonmagnetic parts 33.

In addition, the magnetic flux density of the magnetic field M, generated by the first magnetic field generators 32A that surround the first holes 50A about the center of the bottom wall 41, is lower than the magnetic flux density of the magnetic field M generated by the second magnetic field generators 32B that surround the second holes 50B remote from the center of the bottom wall 41. As a result, the density of the high-density plasma PH generated in the first paths 51 of the first holes 50A is lower than the density of the high-density plasma PH generated in the first paths 51 of the second holes 50B.

As described above, any of the first magnetic field generators 32A, the second magnetic field generators 32B, and the nonmagnetic parts 33 are selectively housed in the recesses 65 to adjust the density of the high-density plasma PH in the direction along the outer surface 41a of the bottom wall 41 (in-plane direction). For example, the density of the high-density plasma PH and the whole plasma P including the high-density plasma PH is adjusted depending on the type of the gas G such that the film C uniformly grows on the wafer W.

The shower head 13 is produced by, for example, additive manufacturing using a 3D printer. This facilitates the manufacturing of the shower head 13 including the magnetic field generators 32 inside the bottom wall 41. The manufacturing method of the shower head 13 is not limited to this example.

In the semiconductor manufacturing apparatus 10 including the shower head 13 in the first embodiment, the magnetic field generators 32 generate the magnetic field M inside the holes 50 between the outer surface 41a and the inner surface 41b. Thus, the magnetic field lines of the magnetic field M pass through the holes 50. When, for example, the gas G containing charged particles (electrons PE and ions PI) is ejected from the diffusion chamber 45 to the outside of the body 31 through the holes 50, the particles circle around the magnetic field lines by the Lorentz force. Specifically, the particles gather around the magnetic field lines, enhancing the density inside and near the holes 50 into which the magnetic field lines pass. The enhanced density of the electrons PE being particles facilitates ionization by collision between the electrons PE and the atoms PA of the gas G and turning of the gas G into a plasma. Thus, with the increased density of the plasma P, the speed of deposition of the semiconductor manufacturing apparatus 10 including the shower head 13 improves. That is, film C forming efficiency of the semiconductor manufacturing apparatus 10 improves.

The magnetization direction of the magnetic field generators 32 aligns with the extending direction of the holes 50. This prevents the magnetic field lines from interfering with the body 31 and can enhance the density of the particles including the electrons PE inside and near the holes 50.

The body 31 is formed of a nonmagnetic material. This prevents the entire body 31 from being magnetized by the magnetic field generators 32, making it possible to control the gathering of the particles including the electrons PE by the magnetic field M.

The magnetic field generator 32 is housed in one of the recesses 65 inside the body 31 and the nonmagnetic part 33 formed of a nonmagnetic material is housed in another of the recesses 65. Specifically, the magnetic field generators 32 or the nonmagnetic parts 33 are selectively housed in the recesses 65, which makes it possible to adjust the density of the plasma P in the direction in parallel with the outer surface 41a depending on, for example, the type of the gas G. In other words, distribution of the plasma P can be controlled.

The magnetic field generators 32 surround at least one of the holes 50. In the first embodiment, the holes 50 are each surrounded by one of the magnets 71. This allows the centers of the magnetic field lines of the magnetic fields M generated by the magnets 71 to match with the central axes Ax of the holes 50. The density of the particles including the electrons PE inside and near the holes 50 can thereby be enhanced.

The first magnetic field generators 32A can generate the magnetic fields M inside the first holes 50A at a magnetic flux density different from a magnetic flux density of the magnetic fields M generated inside the second holes 50B by the second magnetic field generators 32B. This makes it possible to adjust the density of the plasma P in the direction in parallel with the outer surface 41a depending on, for example, the type of the gas G.

The alternating current power source 75 causes the hollow cathode discharge inside the first paths 51 that are wider than the second paths 52. By the hollow cathode discharge, charged particles including the electrons PE reciprocates motion inside the first paths 51, enhancing the density of the particles inside the first paths 51. With the enhanced density of the electrons PE being particles, the electrons PE and the atoms PA of the gas G are more likely to collide and be ionized, readily turning the gas G into a plasma. This enhances the density of the plasma P, and the speed of deposition of the semiconductor manufacturing apparatus 10, for example.

Second Embodiment

Figure 7:
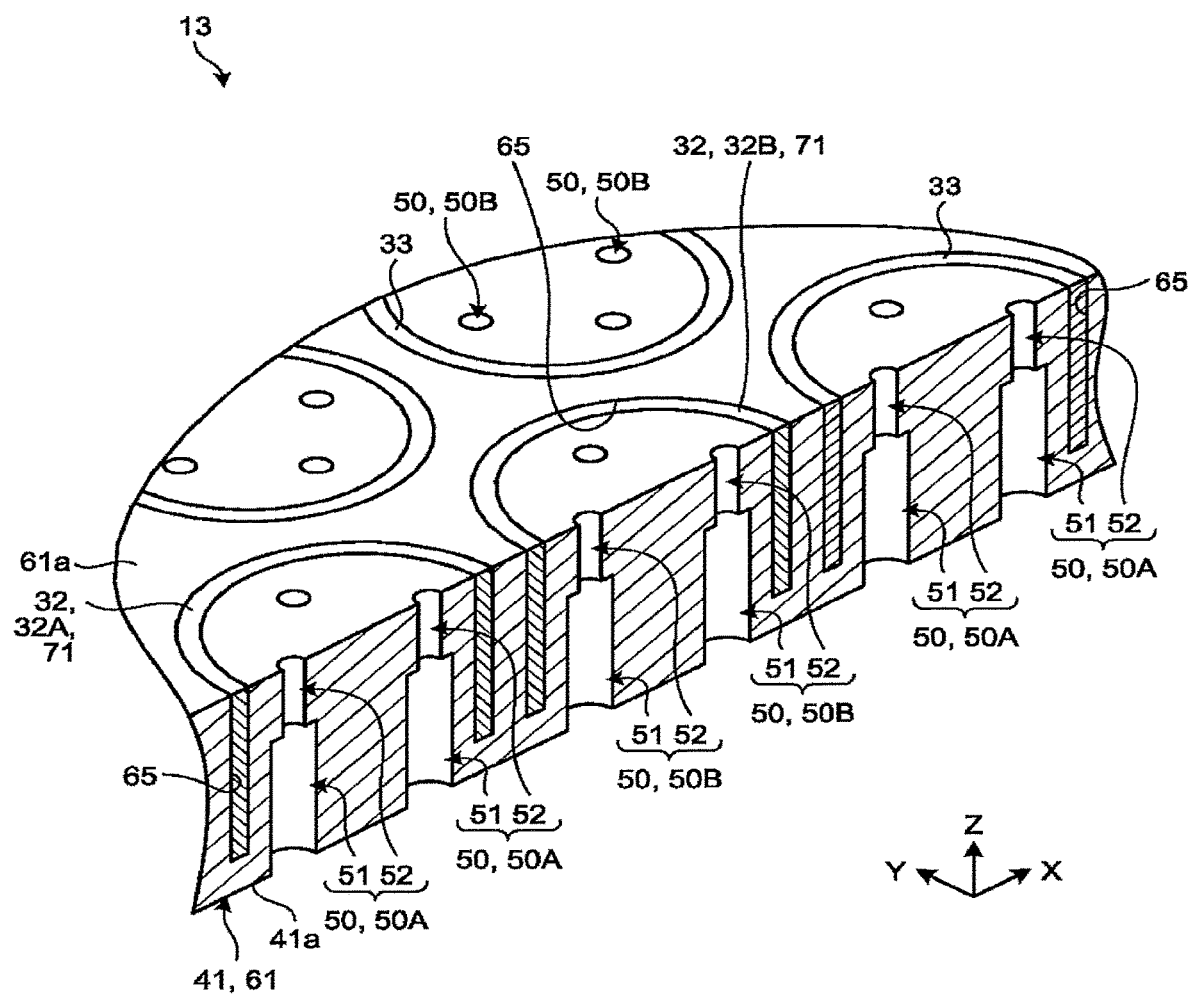
FIG. 7 is a perspective view of part of a first wall and a plurality of magnets according to a second embodiment.

The following describes a second embodiment with reference to FIG. 7. In the embodiments to be described hereunder, elements having functions similar to the functions of the elements described in the first embodiment will be denoted by the same reference numerals as in the first embodiment and detailed descriptions therefor may be omitted. The elements denoted by the same reference numerals do not necessarily have common functions and characteristics and may have different functions and characteristics depending on the respective embodiments.

FIG. 7 is a perspective view of part of a first wall 61 and a plurality of magnets 71 according to the second embodiment. As illustrated in FIG. 7, in the second embodiment, recesses 65 and the magnets 71 or nonmagnetic parts 33 housed in the recesses 65 surround a plurality of holes 50.

Distances (e.g., the shortest distance) between the holes 50 and the magnets 71 or the nonmagnetic parts 33 that surround the holes 50 are substantially equal. The distances between the holes 50 and the magnets 71 or the nonmagnetic parts 33 may nonetheless be unequal.

The magnets 71 generate the magnetic fields M inside the holes 50 surrounded by the magnets 71. The magnetic fields M generated by the magnets 71 include magnetic field lines that extend along the central axes Ax of the holes 50 surrounded by the magnets 71 between an outer surface 41a and an inner surface 41b of a bottom wall 41.

In a semiconductor manufacturing apparatus 10 including a shower head 13 in the second embodiment, each magnetic field generator 32 surrounds at least one of the holes 50. In the second embodiment the magnetic field generator 32 surrounds two or more holes 50, therefore, one magnetic field generator 32 can generate the magnetic field M inside the two or more holes 50, enabling a reduction in the number of the magnetic field generators 32. Furthermore, the distances between the magnetic field generators 32 and the holes 50 are equal to each other. Thus, intensity levels of the magnetic fields M generated inside the holes 50 can be made substantially equal to each other.

Third Embodiment

Figure 8:
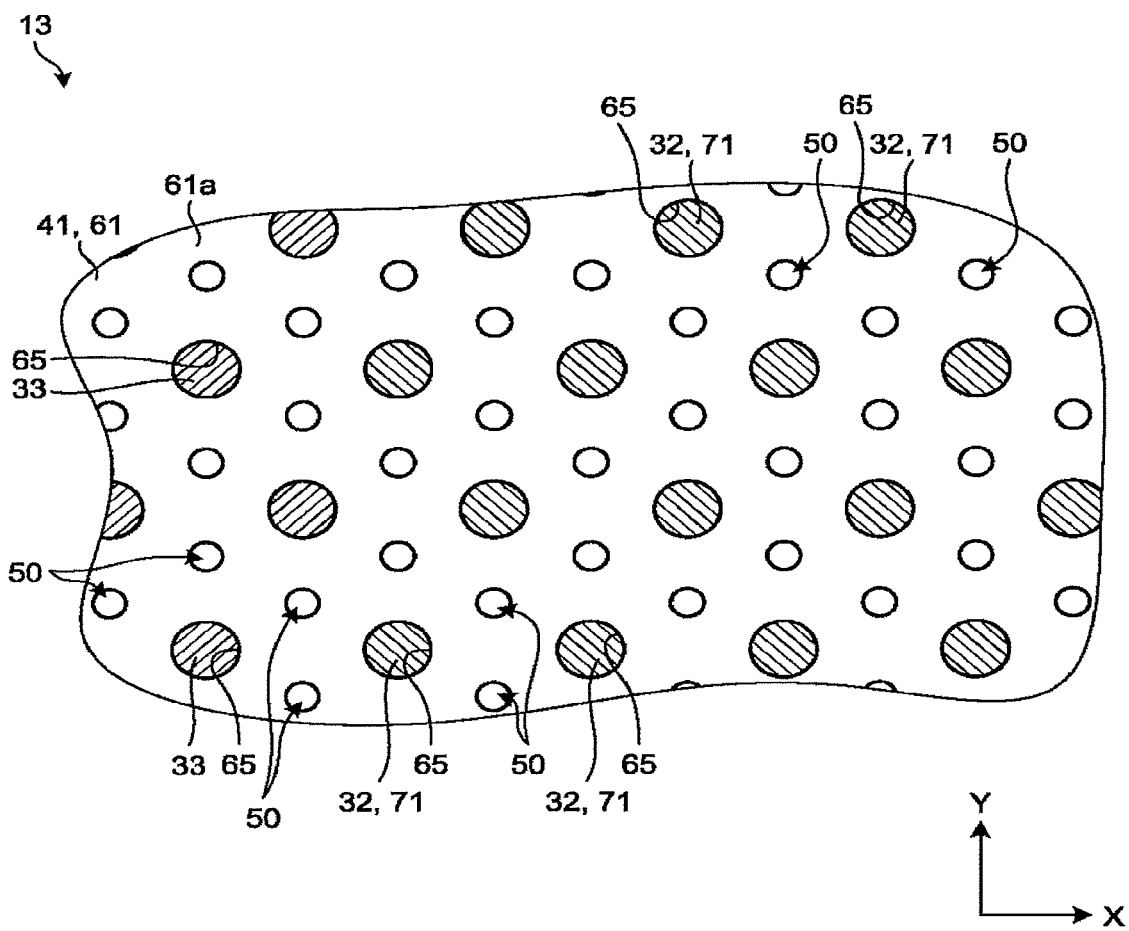
FIG. 8 is a plan view of a first wall according to a third embodiment.

The following describes a third embodiment with reference to FIG. 8. FIG. 8 is a plan view of a first wall 61 according to the third embodiment. As illustrated in FIG. 8, in the third embodiment, magnets 71 and nonmagnetic parts 33 each have a bar shape. For example, recesses 65, the magnets 71, and the nonmagnetic parts 33 have a cylindrical shape extending in the Z-axis direction. For better understanding, the magnets 71 and the nonmagnetic parts 33 are hatched in FIG. 8. The recesses 65, the magnets 71, and the nonmagnetic parts 33 may nonetheless have another shape.

The distances between holes 50 and their adjacent magnets 71 or nonmagnetic parts 33 are substantially equal to each other. The distances between the holes 50 and the magnets 71 or the nonmagnetic parts 33 may nonetheless be unequal.

Each magnet 71 generate the magnetic field M inside the adjacent holes 50. The magnetic field M generated by the magnet 71 has magnetic field lines that extend along the central axes Ax of the adjacent holes 50 between an outer surface 41a and an inner surface 41b of a bottom wall 41.

In a semiconductor manufacturing apparatus 10 including a shower head 13 in the third embodiment, magnetic field generators 32 have a columnar shape extending in the Z-axis direction. This enhances the degree of freedom in arranging the magnetic field generators 32. Additionally, the distances between the magnetic field generators 32 and the holes 50 are equal to each other. Thus, intensity levels of the magnetic fields M generated inside the holes 50 can be made substantially equal to each other.

Fourth Embodiment

Figure 9:
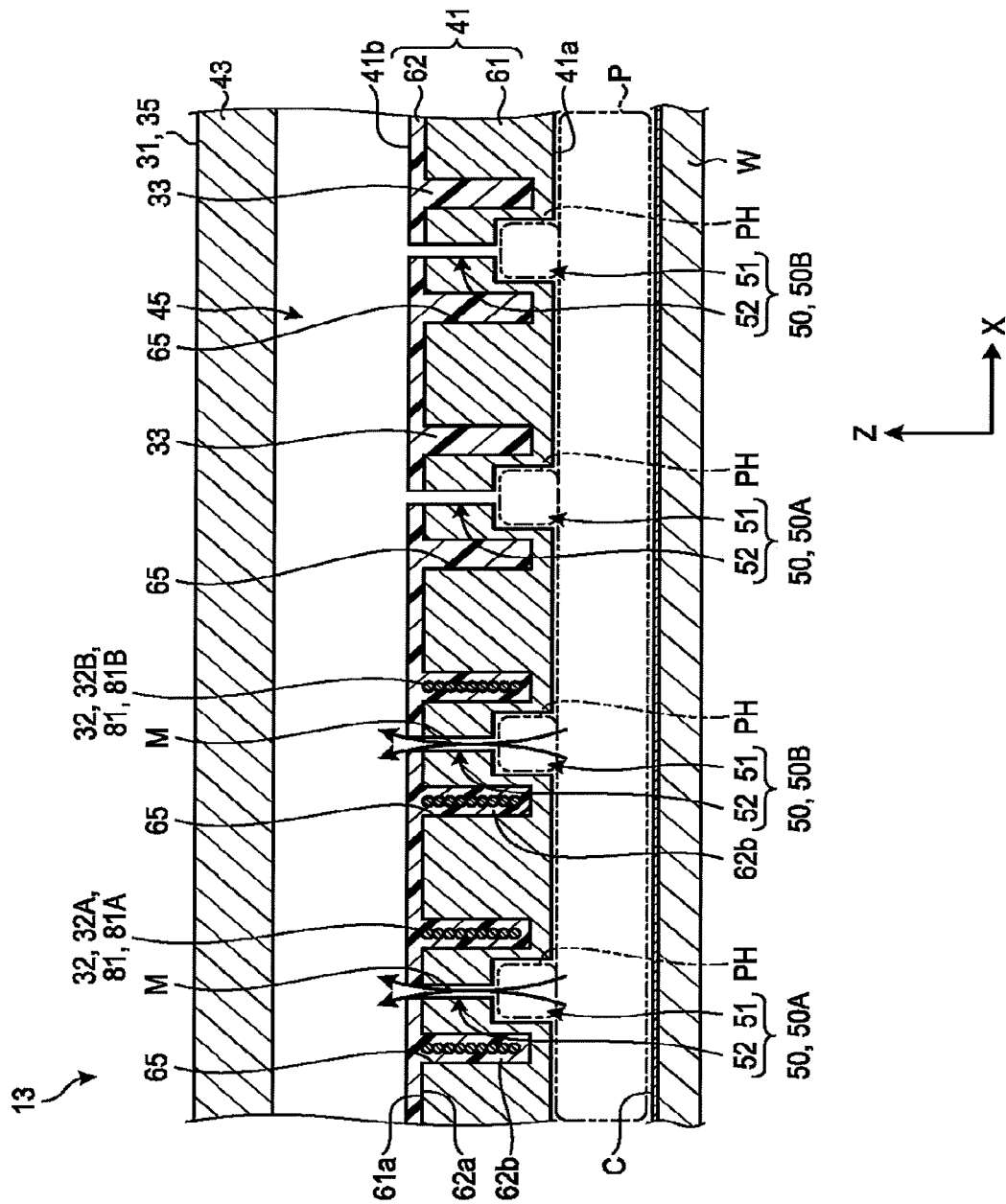
FIG. 9 is a cross-sectional view of part of a shower head according to a fourth embodiment.
Figure 10:
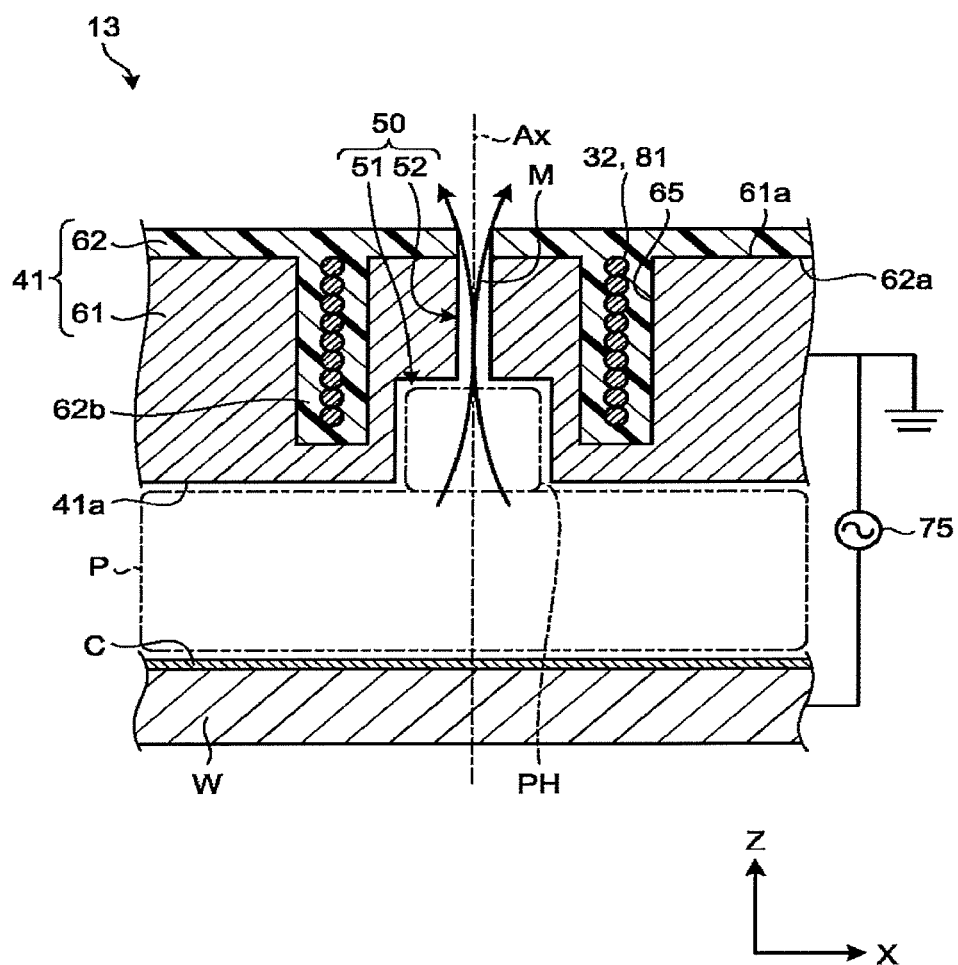
FIG. 10 is a cross-sectional view of part of a bottom wall in the fourth embodiment.
Figure 11:
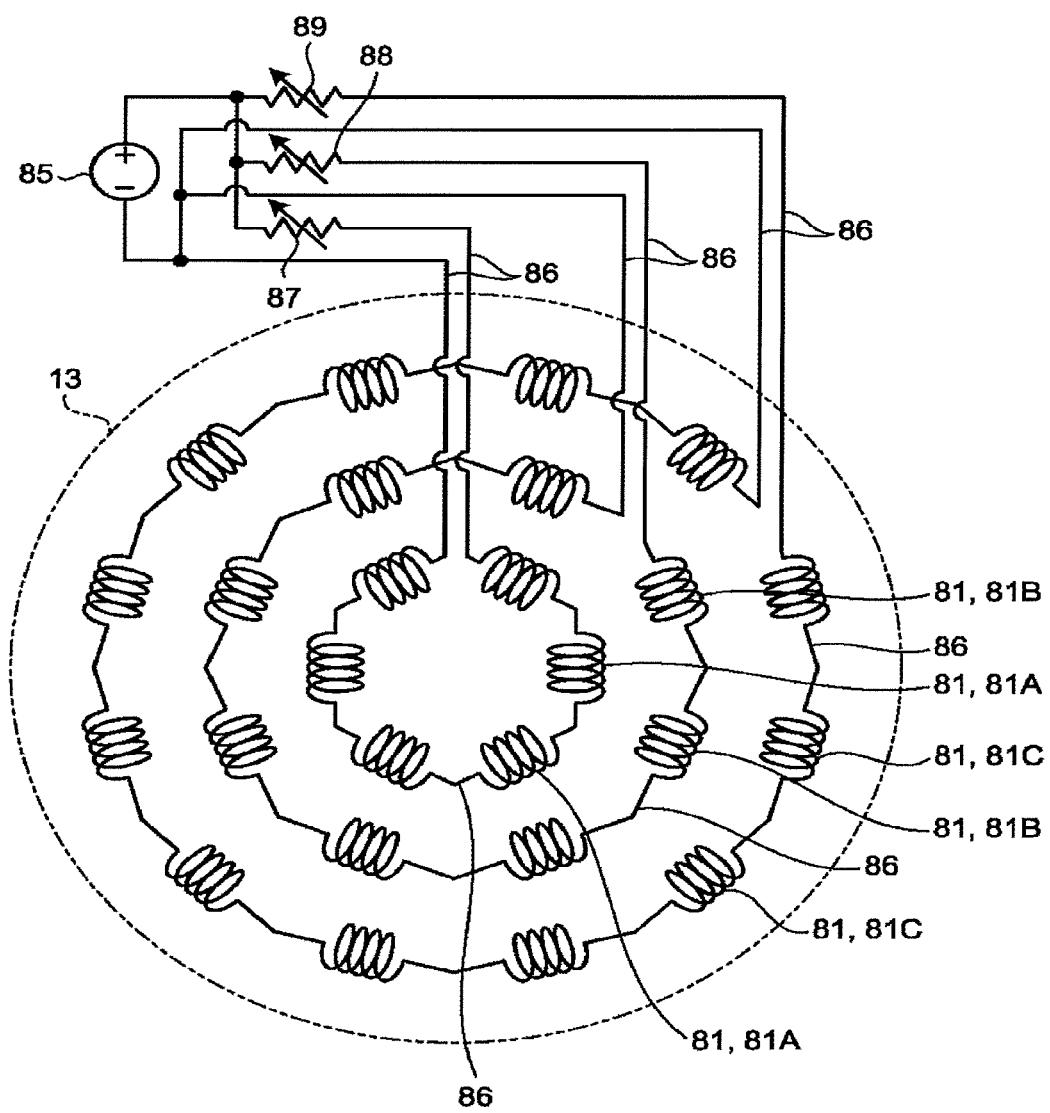
FIG. 11 is a schematic circuit diagram of the shower head in the fourth embodiment.

The following describes a fourth embodiment with reference to FIGS. 9 to 11. FIG. 9 is a cross-sectional view of part of a shower head 13 according to the fourth embodiment. As illustrated in FIG. 9, a plurality of magnetic field generators 32 in the fourth embodiment include a plurality of coils 81.

The coils 81 are housed in recesses 65. Thus, a bottom wall 41 includes the coils 81 of the magnetic field generators 32. The coils 81 are of a cylindrical shape wound around the holes 50 surrounded by the recesses 65. In other words, the coils 81 has a cylindrical shape extending along the central axes Ax of the holes 50. The coils 81 may have another shape.

FIG. 10 is a cross-sectional view of part of the bottom wall 41 in the fourth embodiment. As illustrated in FIG. 10, the coils 81 are magnetized by a flow of current to function as electromagnets that generate the magnetic field M. The coils 81 are magnetized in the Z-axis direction and the extending direction of the hole 50. The orientation of the magnetic field M generated by each coil 81 is changed by the flow of current through the coil 81.

In the fourth embodiment, the second wall 62 includes a plurality of cylinders 62*b*. The cylinders 62*b* protrude from a second bonding surface 62*a* and are housed in at least one of the recesses 65. The coils 81 are disposed inside the cylinders 62*b*. The cylinders 62*b* are housed in the recesses 65, so that the coils 81 are housed in the recesses 65.

As illustrated in FIG. 9, in the fourth embodiment, nonmagnetic parts 33 are formed integrally with the second wall 62. The nonmagnetic parts 33 protrude from the second bonding surface 62*a* and are housed in at least one of the recesses 65.

In the fourth embodiment, the second wall 62 is formed of, for example, a synthetic resin such as engineering plastics. The coils 81 are disposed inside the second wall 62 by, for example, insert molding. The second wall 62 is located inside the shower head 13. Because of this, the second wall 62 is prevented from being exposed to the plasma P.

FIG. 11 is a schematic circuit diagram of the shower head 13 in the fourth embodiment. As illustrated in FIG. 11, a semiconductor manufacturing apparatus 10 in the fourth embodiment includes a power source 85, a plurality of wires 86, a first variable resistor 87, a second variable resistor 88, and a third variable resistor 89.

The power source 85 is, for example, a direct current power source. The power source 85 may nonetheless be an alternating current power source. The power source 85 is located outside the shower head 13. The wires 86 electrically connect the power source 85 and the coils 81. The wires 86 insert into the second wall 62, a peripheral wall 42, a top wall 43, and a pipe 36 by, for example, insert molding. The wires 86 are not limited to this example.

The coils 81 include a plurality of first coils 81A, a plurality of second coils 81B, and a plurality of third coils 81C. The first coils 81A are exemplary first magnetic field generators. The second coils 81B are exemplary second magnetic field generators.

The first coils 81A are, for example, part of the coils 81 about the center of the bottom wall 41. The second coils 81B are part of the coils 81 remoter from the center of the bottom wall 41 than the first coils 81A. The third coils 81C are part of the coils 81 remoter from the center of the bottom wall 41 than the second coils 81B.

The first coils 81A are connected in series to each other and to the power source 85 via the wires 86. The first variable resistor 87 is disposed between the first coils 81A and the power source 85. The first variable resistor 87 adjusts a value of current flowing from the power source 85 to the first coils 81A.

The second coils 81B are connected in series to each other and to the power source 85 via the wires 86. The second variable resistor 88 is disposed between the second coils 81B and the power source 85. The second variable resistor 88 adjusts a value of current flowing from the power source 85 to the second coils 81B.

The third coils 81C are connected in series to each other and to the power source 85 via the wires 86. The third variable resistor 89 is disposed between the third coils 81C and the power source 85. The third variable resistor 89 adjusts a value of current flowing from the power source 85 to the third coils 81C. The first coils 81A, the second coils 81B, and the third coils 81C may be connected in parallel to each other.

The control unit 16 illustrated in FIG. 1 individually controls the first variable resistor 87, the second variable resistor 88, and the third variable resistor 89. For example, the control unit 16 varies electrical resistance values of the first variable resistor 87, the second variable resistor 88, and the third variable resistor 89. Thereby, the first coils 81A generate the magnetic field M inside holes 50 at a magnetic flux density different from a magnetic flux density of the magnetic field M generated inside the holes 50 by the second coils 81B. As illustrated in FIG. 9, for example, the first coils 81A generate the magnetic field M inside first holes 50A and the second coils 81B generate the magnetic field M inside second holes 50B.

The second coils 81B generate the magnetic field M inside the holes 50 at a magnetic flux density different from a magnetic flux density of the magnetic field M generated inside the holes 50 by the third coils 81C. As such, the first coils 81A, the second coils 81B, and the third coils 81C generate the magnetic field M at different magnetic flux densities.

The first variable resistor 87, the second variable resistor 88, and the third variable resistor 89 vary values of current flowing through the first coils 81A, the second coils 81B, and the third coils 81C, respectively, to adjust the magnetic flux density of the magnetic field M generated by each of the first coils 81A, the second coils 81B, and the third coils 81C. Thereby, the density of the high-density plasma PH can be adjusted in the direction along an outer surface 41*a* of the bottom wall 41. For example, the density of the high-density plasma PH and the whole plasma P including the high-density plasma PH is adjusted depending on the type of the gas G such that the film C uniformly grows on the wafer W.

The magnetic flux density of the magnetic field M generated by each of the first coils 81A, the second coils 81B, and the third coils 81C may be adjusted through another method. For example, a switch may be provided to electrically connect (ON) or disconnect (OFF) a circuit between each of the first coils 81A, the second coils 81B, and the third coils 81C and the power source 85 depending on the type of the gas G.

In the semiconductor manufacturing apparatus 10 including the shower head 13 in the fourth embodiment, the magnetic field generators 32 include the coils 81 wound about at least one of the holes 50. This makes it possible to adjust the magnetic flux density of the magnetic field M by a flow of current through the coils 81. The coils 81 are exemplary coils and magnetic field generators. The magnetic field generators are arbitrarily configured as long as they are included in the shower head 13 and capable of generating the magnetic field. The power source 85 that applies flows of current to the coils 81 is disposed outside the shower head 13 in the fourth embodiment, however, it may be disposed inside the shower head 13.

In the first to fourth embodiments described above, each hole 50 includes the first path 51 and the second path 52 and the hollow cathode discharge occurs inside the first path 51. The holes 50 may have a certain inner diameter. In this case, the electrons PE are trapped by the magnetic field lines of the magnetic field M near the holes 50 outside the shower head 13. As a result, the electrons PE are likely to collide with the atoms PA between the shower head 13 and the wafer W, enhancing the density of the plasma P.

In the first to fourth embodiments, the bottom wall 41 is formed integrally with the shower head 13. The bottom wall 41 may be a shower plate as an independent part. For example, the bottom wall 41 being the shower plate may be attached to the chamber 21, thereby defining the diffusion chamber 45 between the inner surface 41b of the bottom wall 41 and the inner surface 23a of the top wall 23. The gas G is supplied from the gas supply unit 14 to the diffusion chamber 45.

In accordance with at least one of the embodiments described above, the magnetic field generators generate the magnetic field inside the holes between the first surface and the second surface. Thus, the magnetic field lines pass through the holes. When a fluid containing charged particles is ejected from the compartment to the outside of the head through the holes, for example, the particles circle around the magnetic field lines by the Lorentz force. Specifically, the particles gather around the magnetic field lines, enhancing the density inside and near the holes into which the magnetic field lines pass. With the enhanced density of the electrons being particles, the electrons and the atoms of the fluid are more likely to collide and be ionized, so that the fluid can turn into a plasma. As a result, along with the enhanced density, for example, the efficiency of the plasma CVD improves.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A shower head, comprising:
    a head including a first surface, a second surface opposite to the first surface, and an internal compartment, the head provided with a plurality of holes that are open to the first surface and to the second surface, the second surface facing the internal compartment, the holes communicating with the internal compartment, the internal compartment being a single cylindrical space formed above the second surface, the head being formed of a nonmagnetic material,
    a nonmagnetic member formed of the nonmagnetic material, and
    a magnetic field generator that generates a magnetic field inside the holes between the first surface and the second surface, wherein
    the holes include a first hole and a second hole,
    the magnetic field generator includes a first magnetic field generator and a second magnetic field generator, the first magnetic field generator that generates a first magnetic field inside the first hole between the first surface and the second surface, the second magnetic field generator that generates a second magnetic field inside the second hole between the first surface and the second surface,
    the first magnetic field generator generates the first magnetic field inside the first hole at a first magnetic flux density different from a second magnetic flux density of the second magnetic field generated inside the second hole by the second magnetic field generator,
    the head is provided with a plurality of internal spaces in which the nonmagnetic member or the magnetic field generator is housed, the plurality of internal spaces being defined by walls separating the internal spaces from each other, and
    the magnetic field generator is housed in one of the internal spaces and the nonmagnetic member is housed in another one of the internal spaces.

2. The shower head according to claim 1, wherein the magnetic field generator is magnetized in a direction in which the holes extend.

3. The shower head according to claim 1, wherein the magnetic field generator surrounds at least one of the holes.

4. The shower head according to claim 1, wherein the magnetic field generator includes a coil wound around at least one of the holes.

5. The shower head according to claim 1, wherein
    the magnetic field generator includes a plurality of magnets each of which generates a magnetic field between the first surface and the second surface, and
    each of the holes is surrounded by one of the magnets.

6. A processing apparatus, comprising:
    a placement part in which an object is disposed;
    the shower head according to claim 1, the shower head that includes the internal compartment to be supplied with a fluid, and ejects the fluid from the holes onto the object disposed in the placement part; and
    an adjuster that adjusts a state of the fluid to be supplied to the internal compartment.

7. The processing apparatus according to claim 6, further comprising:
    a power source that generates a potential difference between the head and the object to turn the fluid into a plasma between the head and the object, wherein
    the holes each include a first path that is open to the first surface, and a second path that is open to the second surface and is narrower than the first path, and
    the power source causes a hollow cathode discharge inside the first path.

8. A shower plate, comprising:
    a wall including a first surface and a second surface opposite to the first surface, and provided with a plurality of holes that are open to the first surface and the second surface, the second surface facing an internal compartment, the internal compartment being a singly cylindrical space formed above the second surface, the wall being formed of a nonmagnetic material;
    a nonmagnetic member formed of the nonmagnetic material; and
    a magnetic field generator that generates a magnetic field inside the holes between the first surface and the second surface, wherein
    the holes include a first hole and a second hole,
    the magnetic field generator includes a first magnetic field generator and a second magnetic field generator, the first magnetic field generator that generates a first magnetic field inside the first hole between the first surface and the second surface, the second magnetic field generator that generates a second magnetic field inside the second hole between the first surface and the second surface, the first magnetic field generator generates the first magnetic field inside the first hole at a first magnetic flux density different from a second magnetic flux density of the second magnetic field generated inside the second hole by the second magnetic field generator, the wall is provided with a plurality of internal spaces in which the nonmagnetic member or the magnetic field generator is housed, the plurality of internal spaces being defined by walls separating the internal spaces from each other, and the magnetic field generator is housed in one of the internal spaces and the nonmagnetic member is housed in another one of the internal spaces.

9. The shower plate according to claim 8, wherein the magnetic field generator surrounds at least one of the holes.

10. The shower plate according to claim 8, wherein the holes each include a first path that is open to the first surface, and a second path that is open to the second surface and is narrower than the first path.

11. The shower head according to claim 1, wherein each of the holes has a circular cross section.

12. The shower head according to claim 1, wherein
the first magnetic field generator includes a first permanent magnet that generates the first magnetic field inside the first hole,
the second magnetic field generator includes a second permanent magnet that generates the second magnetic field inside the second hole, and
the first permanent magnet generates the first magnetic field inside the first hole at the first magnetic flux density different from the second magnetic flux density of the second magnetic field generated inside the second hole by the second permanent magnet.

13. The shower head according to claim 1, wherein the head is formed of an electrically conductive material.

14. The processing apparatus according to claim 6, further comprising:
a power source that generates a potential difference between the head and the object to turn the fluid into a plasma between the head and the object, wherein
the head is formed of an electrically conductive material,
each of the holes includes a first path that is open to the first surface, and a second path that is open to the second surface and is narrower than the first path, and
the power source causes a hollow cathode discharge inside the first path.

* * * * *